United States Patent
Wada (10) Patent No.: US 10,128,085 B2
(45) Date of Patent: Nov. 13, 2018

(54) METHOD OF PLASMA ETCHING (71) Applicant: Tokyo Electron Limited, Tokyo (JP)

(72) Inventor: Toshiharu Wada, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 15/346,886

(22) Filed: Nov. 9, 2016

(65) Prior Publication Data
US 2017/0148610 A1 May 25, 2017

(30) Foreign Application Priority Data

Nov. 19, 2015 (JP) .................................. 2015-226524

(51) Int. Cl.
| | |
|---|---|
| *H01J 37/32* | (2006.01) |
| *H01L 21/3065* | (2006.01) |
| *H01L 21/308* | (2006.01) |
| *H01L 21/311* | (2006.01) |

(52) U.S. Cl.
CPC .. *H01J 37/32009* (2013.01); *H01J 37/32091* (2013.01); *H01J 37/32146* (2013.01); *H01J 37/32165* (2013.01); *H01J 37/32568* (2013.01); *H01J 37/32577* (2013.01); *H01L 21/3065* (2013.01); *H01L 21/3081* (2013.01); *H01L 21/31138* (2013.01); *H01L 21/31144* (2013.01); *H01J 2237/334* (2013.01)

(58) Field of Classification Search
CPC .................................................. H01J 37/32009
See application file for complete search history.

(56) References Cited

U.S. PATENT DOCUMENTS

| | | | |
|---|---|---|---|
| 2012/0052689 A1* | 3/2012 | Tokashiki | H01J 37/32091 438/714 |
| 2013/0049592 A1* | 2/2013 | Yeom | H01J 37/32091 315/111.21 |
| 2015/0128991 A1* | 5/2015 | Brown | H01L 21/31133 134/1 |
| 2015/0206792 A1 | 7/2015 | Hsieh et al. | |

* cited by examiner

Primary Examiner — Roberts P Culbert (74) Attorney, Agent, or Firm — IPUSA, PLLC (57) ABSTRACT

A method of plasma etching includes an etching process that generates plasma from a process gas that includes fluorocarbon by using first high frequency power output by a first high frequency power source, and by the generated plasma, etches a low-k film with a metal-containing film as a mask. In the etching process, the first high frequency power is intermittently applied.

8 Claims, 6 Drawing Sheets

METHOD OF PLASMA ETCHING

CROSS-REFERENCE TO RELATED APPLICATIONS

This patent application is based upon and claims the benefit of priority of Japanese Patent Application No. 2015-226524, filed on Nov. 19, 2015, the entire contents of which are incorporated herein by reference.

BACKGROUND OF THE INVENTION

1. Field of the Invention

The present disclosure relates to a method of plasma etching.

2. Description of the Related Art

Conventionally, as a technology that realizes finer microfabrication of semiconductor devices, a method using self-aligned vias (SAV) has been disclosed (see, for example, the United States Laid-open Patent Publication No. 2015/0206792). In a method using SAV, plasma etching is executed using as a mask a hard mask that is formed of an organic film such as resist, and a metal-containing film such as titanium nitride (TiN), for example, to form holes into a low-k film that is used as a film between wiring layers. Note that a low-k film is a generic term of films that have the relative permittivity lower than that of $SiO_2$.

However, in a method as described above, the selectivity of the metal-containing film with respect to the low-k film is not sufficient in plasma etching. Therefore, if plasma etching is executed with the organic film and the metal-containing film as the mask, there may be a case where so-called "encroachment" is generated, namely, a part of the metal-containing film is encroached.

SUMMARY OF THE INVENTION

In view of the above problem, it is an object of an aspect in the present disclosure to improve the selectivity of a metal-containing film with respect to a low-k film.

According to an embodiment, a method of plasma etching includes an etching process that generates plasma from a process gas that includes fluorocarbon by using first high frequency power output by a first high frequency power source, and by the generated plasma, etches a low-k film with a metal-containing film as a mask. In the etching process, the first high frequency power is intermittently applied.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

In the following, embodiments will be described with reference to the drawings. Note that the same reference symbols are assigned to substantially the same elements throughout the specification and the drawings, and duplicated description will be omitted.

[Overall Configuration of Plasma Etching Apparatus]

Figure 1:
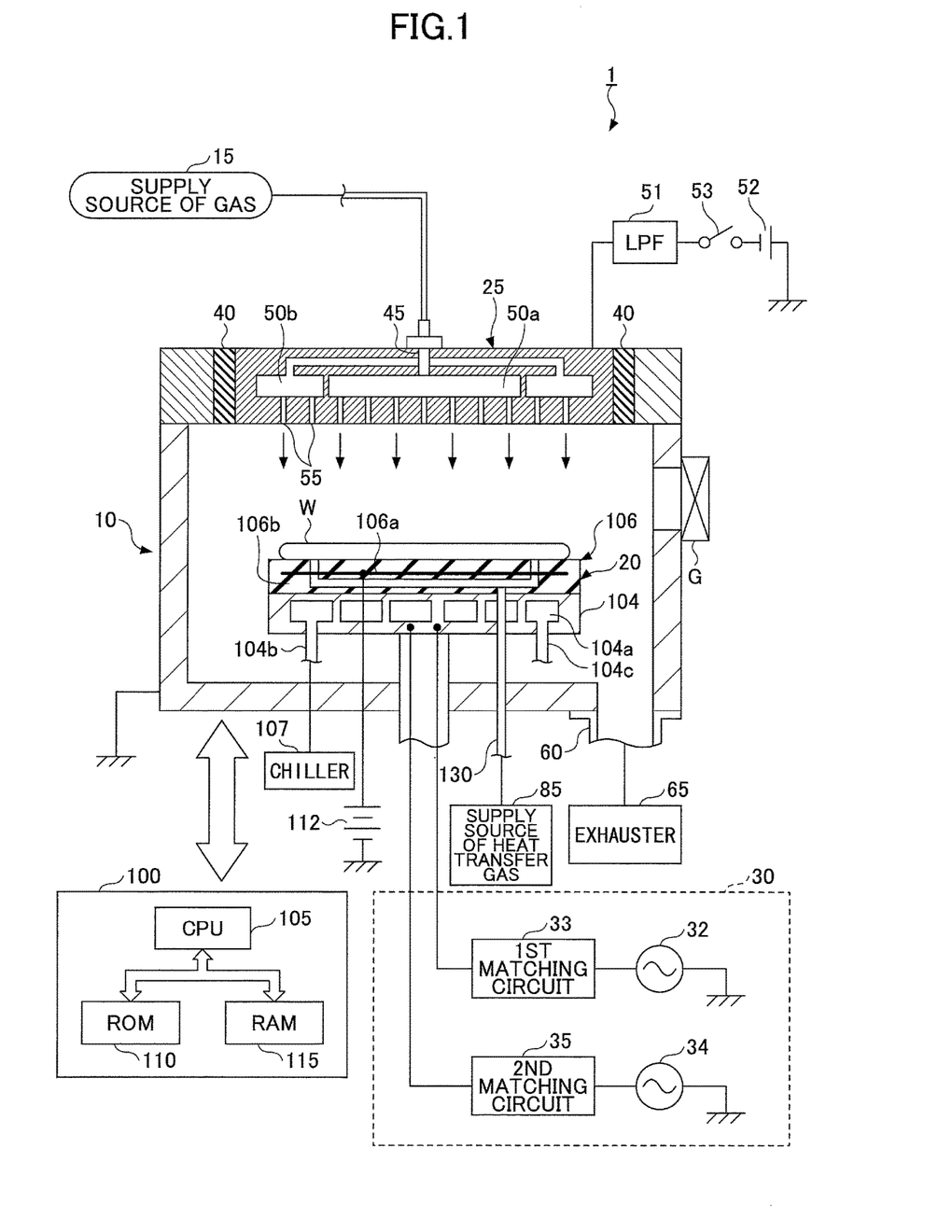
FIG. 1 is a diagram illustrating an example of a vertical cross section of a plasma etching apparatus according to an embodiment.

First, a plasma etching apparatus according to an embodiment in the present disclosure will be described based on FIG. 1. FIG. 1 is a diagram illustrating an example of a vertical cross section of a plasma etching apparatus 1 according to the embodiment.

The plasma etching apparatus 1 in the embodiment is a parallel-plate plasma etching apparatus (a capacitively coupled plasma etching apparatus) that has a chamber 10 in which a holding table 20 and a gas shower head 25 are placed facing each other. The holding table 20 has a function to hold a semiconductor wafer (simply referred to as the "wafer W", below) as an example of a substrate, and also functions as a lower electrode. The gas shower head 25 has a function to supply a shower of gas into the chamber 10, and also functions as an upper electrode.

The chamber 10 is formed of, for example, aluminum having an alumite treatment (anodic oxidation) applied to the surface, and has a cylinder shape. The chamber 10 is an example of a process chamber. The chamber 10 is electrically grounded. The holding table 20 is disposed at a bottom part of the chamber 10, on which the wafer W is placed.

The holding table 20 is formed of, for example, aluminum (Al), titanium (Ti), silicon carbide (SiC), and the like. On the upper surface of the holding table 20, an electrostatic chuck 106 is provided to electrostatically attract the wafer W. The electrostatic chuck 106 has a structure in which a chuck electrode 106a is interposed between insulators 106b.

The chuck electrode 106a is connected to a DC voltage source 112 from which a DC voltage is supplied to the chuck electrode 106a. Thus, Coulomb force attracts the wafer W to the electrostatic chuck 106.

The holding table 20 is supported by a support 104. A coolant passage 104a is formed in the support 104. The coolant passage 104a has a coolant inlet pipe 104b and a coolant outlet pipe 104c connected. A cooling medium, such as cooling water and brine output from a chiller 107, circulates through the coolant inlet pipe 104b, the coolant passage 104a, and the coolant outlet pipe 104c. This circulation cools down the holding table 20 and the electrostatic chuck 106.

A supply source of heat transfer gas 85 supplies heat transfer gas such as helium gas (He) and argon gas (Ar) to the reverse side of the wafer W on the electrostatic chuck 106 through a gas supply line 130. Configured as such, the temperature of the electrostatic chuck 106 is controlled by the cooling medium circulated through the coolant passage 104a, and the heat transfer gas supplied to the reverse side of the wafer W. Consequently, the wafer W can be controlled to maintain a predetermined temperature.

The holding table 20 is connected with a power supply apparatus 30 that supplies two-frequency superposed power. The power supply apparatus 30 includes a first high frequency power source 32 to supply first high frequency power HF (high frequency power for generating plasma) at a first frequency, and a second high frequency power source 34 to supply second high frequency power LF (high frequency power for generating bias voltage) at a second frequency lower than the first frequency. The first high frequency power source 32 is electrically connected with the holding table 20 via a first matching circuit 33. The second high frequency power source 34 is electrically connected with the holding table 20 via a second matching circuit 35. The first high frequency power source 32 applies the first high frequency power HF for generating plasma, for example, at 40 MHz to the holding table 20. The second high frequency power source 34 applies the second high frequency power LF for generating bias voltage, for example, at 13 MHz to the holding table 20. Note that although the first high frequency power HF is applied to the holding table 20 in the embodiment, the power may be applied to the gas shower head 25.

The first matching circuit 33 makes the load impedance match with the internal (or output) impedance of the first high frequency power source 32. The second matching circuit 35 makes the load impedance match with the internal (or output) impedance of the second high frequency power source 34. The first matching circuit 33 functions so that the internal impedance of the first high frequency power source 32 seemingly match with the load impedance when plasma is being generated in the chamber 10. Also, the second matching circuit 35 functions so that the internal impedance of the second high frequency power source 34 seemingly match with the load impedance when plasma is being generated in the chamber 10.

The gas shower head 25 is formed of, for example, silicon, and attached to the chamber 10 so as to cover up an opening at the ceiling part of the chamber 10, together with a shield ring 40 covering the periphery of the gas shower head 25.

The gas shower head 25 is electrically connected with a variable DC power source 52 via a low-pass filter (LPF) 51. The variable DC power source 52 has its negative electrode connected with the gas shower head 25, to apply a negative DC voltage to the gas shower head 25. Supplying power from the variable DC power source 52 can be turned on and off by an on-off switch 53. The low-pass filter 51 traps high frequencies from the first high frequency power source 32 and the second high frequency power source 34, and is preferably constituted with an LR filter or an LC filter. Note that the gas shower head 25 may be electrically grounded, without electrically connected with the variable DC power source 52.

The gas shower head 25 has a gas inlet 45 formed to introduce gas. In the gas shower head 25, a diffusion chamber 50a around the center, and a diffusion chamber 50b close to the edge are provided, branched off from the gas inlet 45. Gas output from a gas supply source 15 is supplied to the diffusion chambers 50a-50b via the gas inlet 45, diffused in the respective diffusion chambers 50a-50b, and introduced into the chamber 10 from a number of gas supply holes 55 towards the holding table 20.

The chamber 10 has an air-exhaust opening 60 formed on the bottom surface, through which the gas in the chamber 10 is exhausted by an exhauster 65 connected to the air-exhaust opening 60. Thus, a predetermined degree of vacuum can be maintained in the chamber 10. On a side wall of the chamber 10, a gate valve G is provided. By opening and closing the gate valve G, the wafer W is taken in and out of the chamber 10.

The plasma etching apparatus 1 has a control unit 100 to control operations of the apparatus as a whole. The control unit 100 includes a CPU (Central Processing Unit) 105, a ROM (Read-Only Memory) 110, and a RAM (Random Access Memory) 115. The CPU 105 executes desired processes including plasma etching, which will be described later, following various recipes stored in these memories. A recipe describes control information about the apparatus with respect to process conditions, including process time, pressure (gas exhaustion), high frequency power, voltage, various amounts of gas flow, temperatures in the chamber (temperature of the upper electrode, temperature of the side wall of the chamber, temperature of the electrostatic chuck, etc.), and temperature of the chiller 107. Note that these programs and the recipes describing the process conditions may be stored in a hard disk or a semiconductor memory. Also, the recipes may be contained in a portable, computer-readable recording medium, such as a CD-ROM and a DVD, to be loaded in a predetermined location in the memory.

When plasma etching is to be executed, the gate valve G is controlled to open and close, through which the wafer W is taken into the chamber 10, and placed on the holding table 20. By supplying a DC voltage from the DC voltage source 112 to the chuck electrode 106a, the wafer W is attracted to the electrostatic chuck 106 and held by the Coulomb force.

Next, etching gas, the first high frequency power HF, and the second high frequency power LF are supplied into the chamber 10 to generate plasma, and plasma etching is executed on the wafer W by the generated plasma. At this moment, a DC voltage may be applied to the gas shower head 25 from the variable DC power source 52.

After the plasma etching has been completed, a DC voltage is applied to the chuck electrode 106a from the DC voltage source 112, with a polarity reverse to that applied when having the wafer W attracted, so as to discharge the electric charge of the wafer W, and to remove the wafer W from the electrostatic chuck 106. Then, the gate valve G is controlled to open and close, through which the wafer W is taken out of the chamber 10.

[Method of Plasma Etching]

In an etching method using SAV, when etching a low-k film by plasma of a process gas that includes fluorocarbon, an organic film and a metal-containing film are used as the mask for etching, to form holes and the like into the low-k film. Here, "fluorocarbon" is a generic term of compounds in which a part or all of hydrogen of hydrocarbon, such as methane and ethane, is replaced with fluorine.

Figure 2A:
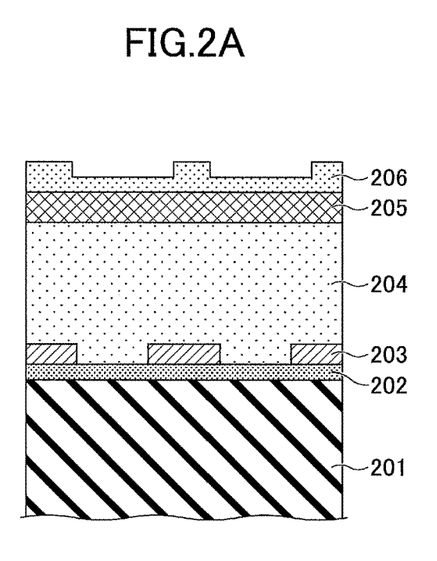
FIGS. 2A-2C are diagrams illustrating etching that uses SAV.

FIG. 2A illustrates an example of stacked films formed over the wafer W before plasma etching is executed. As illustrated in FIG. 2A, the stacked films includes a low-k film 201 as a film to be etched, a tetraethoxysilane film 202 (TEOS), a TiN film 203, an organic film 204 (ODL), an oxide film 205, and a photoresist 206 stacked in this order on the low-k film 201. The TiN film 203 is an example of a metal-containing film. The low-k film 201 is, for example, an SiOCH film. The oxide film 205 is, for example, a silicon-containing film such as a Si-containing Anti-Reflective Coating layer (SiARC). Note that a base film may be formed between the wafer W and the low-k film 201.

Figure 2B:
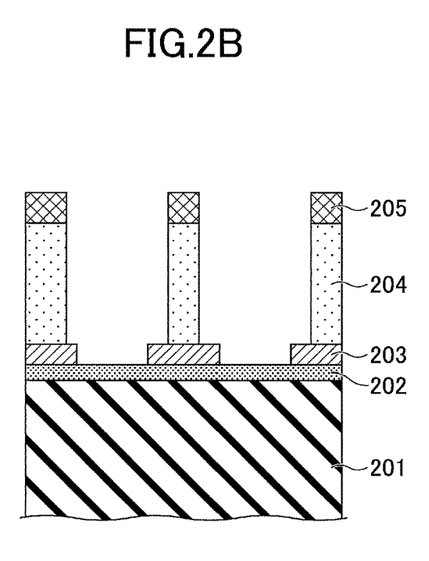
Figure 2C:
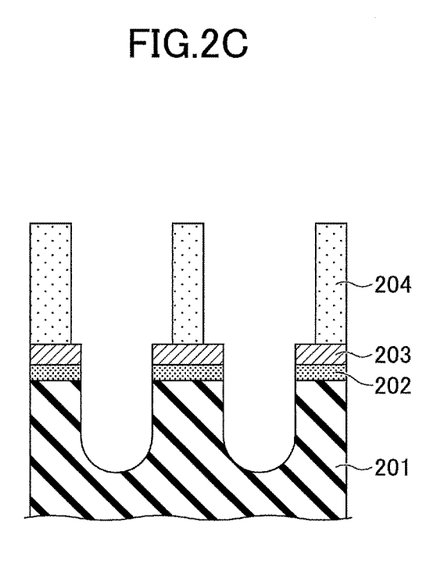

When etching that uses SAV is to be executed on the sample illustrated in FIG. 2A, first, as illustrated in FIG. 2B, etching is executed on the oxide film 205 and the organic film 204 with the photoresist 206 as the mask, and then, the photoresist 206 is removed. Next, as illustrated in FIG. 2C, etching is executed on the low-k film 201 by using the organic film 204 and the TiN film 203 as the mask.

At this moment, if the selectivity of the TiN film 203 with respect to the low-k film 201 is not sufficient, etching the low-k film 201 with the organic film 204 and the TiN film 203 as the mask, may cause a risk of generating so-called "encroachment", or a part of the TiN film 203 is encroached.

Figure 3:
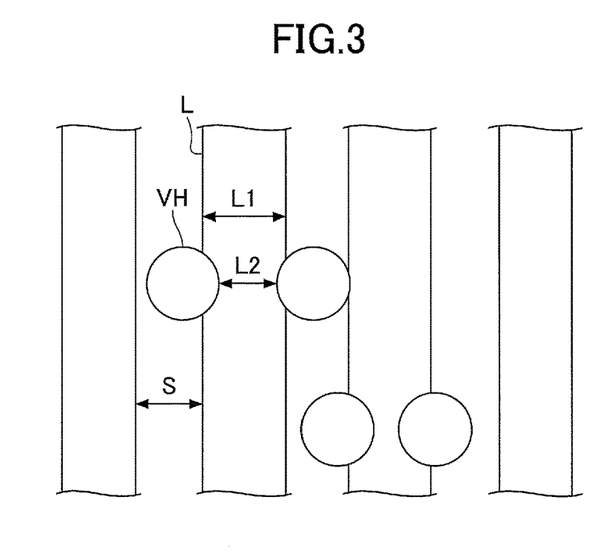
FIG. 3 is a diagram illustrating encroachment.

FIG. 3 is a diagram illustrating encroachment, namely, a schematic plan view of a pattern that includes lines L aligned having predetermined spaces S interposed. As illustrated in FIG. 3, in the pattern that includes the lines L aligned having the predetermined spaces S interposed, encroachment is a difference between a width L1 of a line L before holes VH are formed into the pattern, and a width L2 of the line L after the holes VH have been formed, and defined as L1-L2.

In the following, methods of plasma etching according to a first embodiment and a second embodiment will be described, respectively, in which the selectivity of the TiN film 203 with respect to the low-k film 201 can be improved for etching the low-k film 201 with the TiN film 203 as the mask.

First Embodiment

According to the first embodiment, the first high frequency power HF is intermittently applied in the etching process, to generate plasma from a process gas that includes fluorocarbon, and by the generated plasma, to etch the low-k film 201 with the TiN film 203 as the mask. This makes it possible to improve the selectivity of the TiN film 203 with respect to the low-k film 201. Consequently, generation of encroachment can be prevented.

Figure 4:
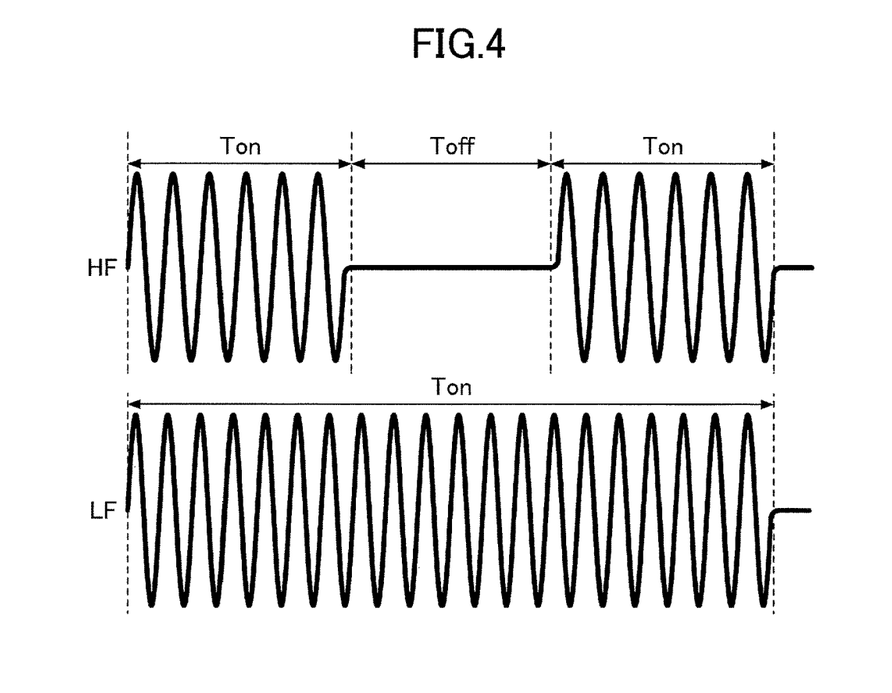
FIG. 4 is a diagram illustrating waveforms of high frequency power according to a first embodiment.

FIG. 4 is a diagram for illustrating waveforms of the high frequency power according to the first embodiment.

As illustrated in FIG. 4, in the etching process in the method of plasma etching according to the first embodiment, the first high frequency power HF is repeatedly turned on and off alternately to apply the first high frequency power HF intermittently. On the other hand, the second high frequency power LF is maintained to be turned on to apply the second high frequency power LF continuously. In other words, the first high frequency power HF is a pulse wave, and the second high frequency power LF is a continuous wave. Note that although the second high frequency power LF is applied as a continuous wave in the first embodiment, the second high frequency power LF may not be applied.

In the following, time during which the high frequency power HF is applied (on time) will be denoted by "Ton", and time during which the high frequency power HF is not applied (off time) will be denoted by "Toff". With these notations, the first high frequency power HF is applied as the pulse wave having the frequency of 1/(Ton+Toff). Also, the duty ratio of the pulse wave, which is the ratio of the on time Ton to the total time of the on time Ton and the off time Toff, is represented by Ton/(Ton+Toff).

Specifically, under the following process conditions, plasma etching was executed on the low-k film 201 with the TiN film 203 as the mask. In the first embodiment, the first high frequency power HF was set as a pulse wave, and the duty ratio was controlled to 30%, 40%, 50%, and 90%. The process conditions are as follows:

the temperature of the lower electrode (the holding table): 10° C.;
the gas: difluoro-methane ($CH_2F_2$)/nitrogen ($N_2$);
the pressure: 30 mTorr;
the first high frequency power HF: 300 W, a pulse wave, the frequency 0.1 kHz;
the second high frequency power LF: 50 W, a continuous wave; and
the DC voltage from the variable DC power source: −450 V.

As a comparative example for this case, the second high frequency power LF was set as a pulse wave instead of the first high frequency power HF, and the duty ratio was controlled to 20%, 50%, and 90%. The process conditions are as follows:

the temperature of the lower electrode (the holding table): 10° C.;
the gas: $CH_2F_2/N_2$;
the pressure: 30 mTorr;
the first high frequency power HF: 300 W, a continuous wave;
the second high frequency power LF: 50 W, a pulse wave, the frequency 0.1 kHz; and
the DC voltage from the variable DC power source: −450 V.

Figure 5:
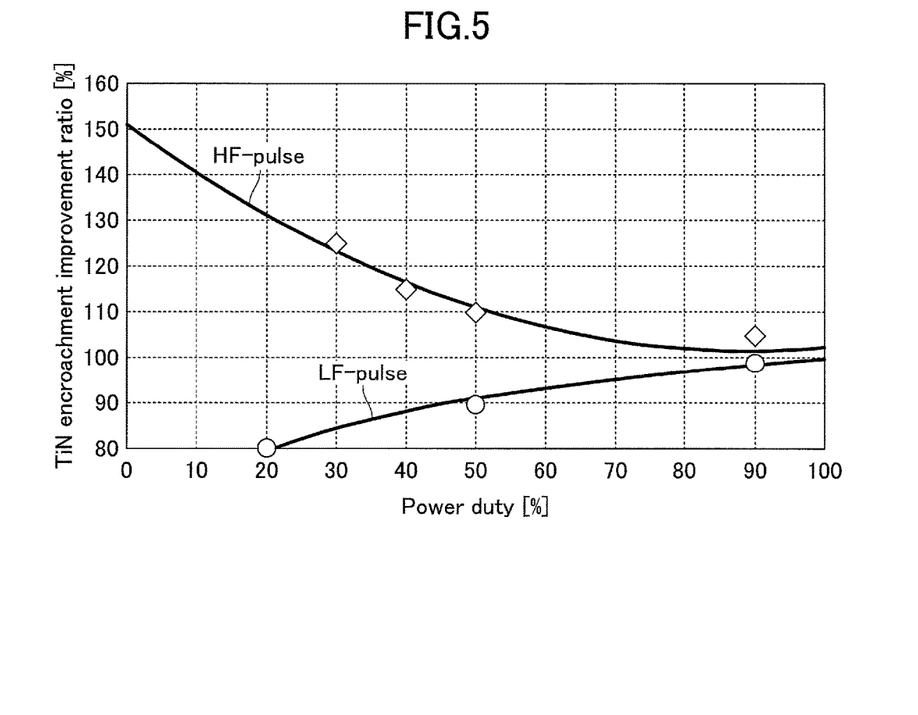
FIG. 5 is a first diagram illustrating an effect of plasma etching according to the first embodiment.

FIG. 5 is a diagram illustrating an effect of the plasma etching according to the first embodiment. FIG. 5 illustrates the improvement ratio (%) of encroachment of the TiN film 203 when the duty ratio of the pulse wave of the first high frequency power HF was controlled to 30%, 40%, 50%, and 90%, relative to the case of the power controlled to be the continuous wave. FIG. 5 also illustrates, as the comparative example, the improvement ratio (%) of encroachment of the TiN film 203 when the duty ratio of the pulse wave of the second high frequency power LF was controlled to 20%, 50%, and 90%, relative to the case of the power controlled to be the continuous wave.

Note that "HF-pulse" in FIG. 5 represents the improvement ratio of encroachment of the TiN film 203 when the first high frequency power HF was set to the pulse wave, and the second high frequency power LF was set to the continuous wave, relative to the case of HF controlled to be the continuous wave. Also, "LF-pulse" in FIG. 5 represents the improvement ratio of encroachment of the TiN film 203 when the first high frequency power HF was set to the continuous wave, and the second high frequency power LF was set to the pulse wave, relative to the case of LF controlled to be the continuous wave.

As illustrated in FIG. 5, the first high frequency power HF set to the pulse wave can increase the improvement ratio of encroachment of the TiN film 203. In other words, the first high frequency power HF set to the pulse wave can prevent encroachment of the TiN film 203. Also, the duty ratio of the pulse wave of the first high frequency power HF set to 50% or below, can especially increase the improvement ratio of encroachment of the TiN film 203.

In contrast to this, the second high frequency power LF set to the pulse wave does not exhibit improvement of encroachment, compared to the case of the first high frequency power HF set to the pulse wave.

Incidentally, when holes and the like are formed by etching the low-k film 201 with the TiN film 203 as the mask by plasma of a process gas that includes fluorocarbon, there is a risk that so-called "μ-loading effect" is generated, in which the etching speed is different depending on the opening size of the holes. This is because a smaller opening size of the holes makes it difficult for CF radicals in the plasma of the process gas that includes fluorocarbon, enter into the holes, compared to a case of a larger opening size of the holes, and hence, the etching speed becomes slower.

In the following, this will be specifically described based on FIG. 6. FIGS. 6A-6C are diagrams illustrating the μ-loading effect.

Figure 6A:
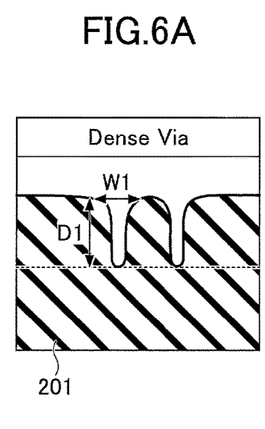
FIGS. 6A-6C are diagrams illustrating μ-loading effect.
Figure 6B:
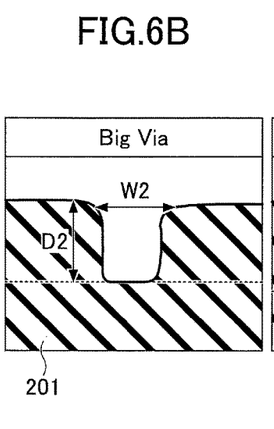

For example, a hole having a smaller opening area (Dense Via) illustrated in FIG. 6A will be compared with a hole having a larger opening area (Big Via) illustrated in FIG. 6B. In this case, even if the plasma etching is executed under the same conditions, the etching speed becomes different, and an etching depth D2 of the hole having the larger opening area (an opening diameter W2) becomes deeper than an etching depth D1 of the hole having the smaller opening area (an opening diameter W1). The μ-loading value (μ-Loading) in this case is represented by a ratio of the etching depth D2 of the hole having the larger opening area to the etching depth D1 of the hole having the smaller opening area, namely, D2/D1.

Figure 6C:
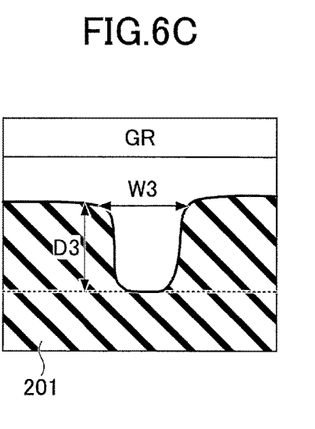

Also, for example, the hole having the smaller opening area illustrated in FIG. 6A will be compared with a guard ring (GR) illustrated in FIG. 6C. Also in this case, even if the plasma etching is executed under the same conditions, the etching speed becomes different, and an etching depth D3 of the guard ring (an opening diameter W3) becomes deeper than the etching depth D1 of the hole having the smaller opening area (the opening diameter W1). The μ-loading value in this case is represented by a ratio of the etching depth D3 of the guard ring to the etching depth D1 of the hole having the smaller opening area, namely, D3/D1.

As such, the etching depth varies due to the difference of the etching speed that depends on the magnitude of the opening diameter.

Thereupon, according to the first embodiment, the first high frequency power HF is intermittently applied in the etching process, to generate plasma from the process gas that includes fluorocarbon, and by the generated plasma, to etch the low-k film 201 with the TiN film 203 as the mask. This makes it possible to prevent the μ-loading effect, and to form holes having different opening diameters into the film to be etched, with a uniform depth at the same time.

Specifically, under the following process conditions, plasma etching was executed on the low-k film 201 with the TiN film 203 having multiple openings of different opening diameters, as the mask. The process conditions are as follows:
the temperature of the lower electrode (the holding table): 10° C.;
the gas: $CH_2F_2/N_2$;
the pressure: 30 mTorr;
the first high frequency power HF: 300 W, a pulse wave, the frequency 0.1 kHz, the duty ratio 30%;
the second high frequency power LF: 50 W, a continuous wave; and
the DC voltage from the variable DC power source: −450 V.

As a comparative example for this case, the first high frequency power HF is controlled to be a continuous wave instead of the pulse wave. The process conditions are as follows:
the temperature of the lower electrode (the holding table): 10° C.;
the gas: $CH_2F_2/N_2$;
the pressure: 30 mTorr;
the first high frequency power HF: 300 W, a continuous wave;
the second high frequency power LF: 50 W, a continuous wave;
the DC voltage from the variable DC power source: −450 V.

Figure 7:
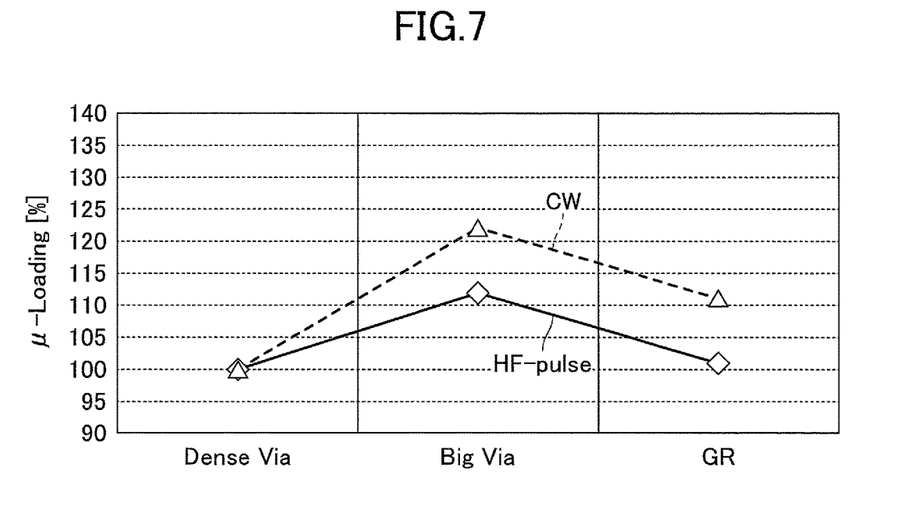
FIG. 7 is a second diagram illustrating an effect of plasma etching according to the first embodiment.

FIG. 7 is a diagram illustrating an effect of the plasma etching according to the first embodiment. FIG. 7 illustrates μ-loading values (%) of a hole having a smaller opening area (Dense Via), a hole having a larger opening area (Big Via), and a guard ring (GR) that have been formed by etching the low-k film 201 with the TiN film 203 as the mask.

Note that "HF-pulse" in FIG. 7 represents the μ-loading values when the first high frequency power HF was set to the pulse wave, and the second high frequency power LF was set to the continuous wave. Also, "CW" in FIG. 7 represents the μ-loading values when the first high frequency power HF and the second high frequency power LF were set to the continuous waves.

As illustrated in FIG. 7, when the first high frequency power HF was set to the pulse wave, and the second high frequency power LF was set to the continuous wave, the μ-loading value when the hole having the larger opening area was formed is closer to 100% than in the case when the first high frequency power HF and the second high frequency power LF were set to the continuous waves. In other words, the difference between the etching depth of the hole having the smaller opening area and the etching depth of the hole having the larger opening area can be reduced.

Also as illustrated in FIG. 7, when the first high frequency power HF was set to the pulse wave, and the second high frequency power LF was set to the continuous wave, the μ-loading value when the guard ring was formed is closer to 100% than in the case when the first high frequency power HF and the second high frequency power LF were set to the continuous waves. In other words, the difference between the etching depth of the hole having the smaller opening area and the etching depth of the guard ring can be reduced.

As such, the first high frequency power HF set to the pulse wave can prevent variations of the etching depths due to the opening sizes of the hole. Consequently, it is possible to form holes having different opening diameters into the film to be etched, with a uniform depth at the same time.

As described above, according to the first embodiment, the first high frequency power HF is used for generating plasma from a process gas that includes fluorocarbon, and by the generated plasma, the etching is executed on the low-k film 201 with the TiN film 203 as the mask. At this moment, the first high frequency power HF is applied intermittently. This makes it possible to improve the selectivity of the TiN film 203 with respect to the low-k film 201, and hence, to prevent generation of encroachment. Also, according to the method of plasma etching in the first embodiment, it is possible to prevent the μ-loading effect, and to form holes having different opening diameters into the film to be etched, with a uniform depth at the same time.

Also, a DC voltage may be applied to the gas shower head 25 in the first embodiment. This accelerates collision of ions onto the surface of the gas shower head 25, to sputter silicon forming the gas shower head 25, and consequently, silicon-containing deposit is piled up on the surface of the TiN film 203. Therefore, the tolerance to plasma is increased for the TiN film 203, and the selectivity of the TiN film 203 with respect to the low-k film 201 is further improved.

Second Embodiment

Next, the method of plasma etching in the second embodiment will be described. In the first embodiment, the method of plasma etching has been described in which the first high frequency power HF is intermittently applied. In contrast to this, in the method of plasma etching in the second embodiment, the first high frequency power HF is intermittently applied, and in addition, the second high frequency power LF is also intermittently applied synchronized with the first high frequency power HF.

Figure 8:
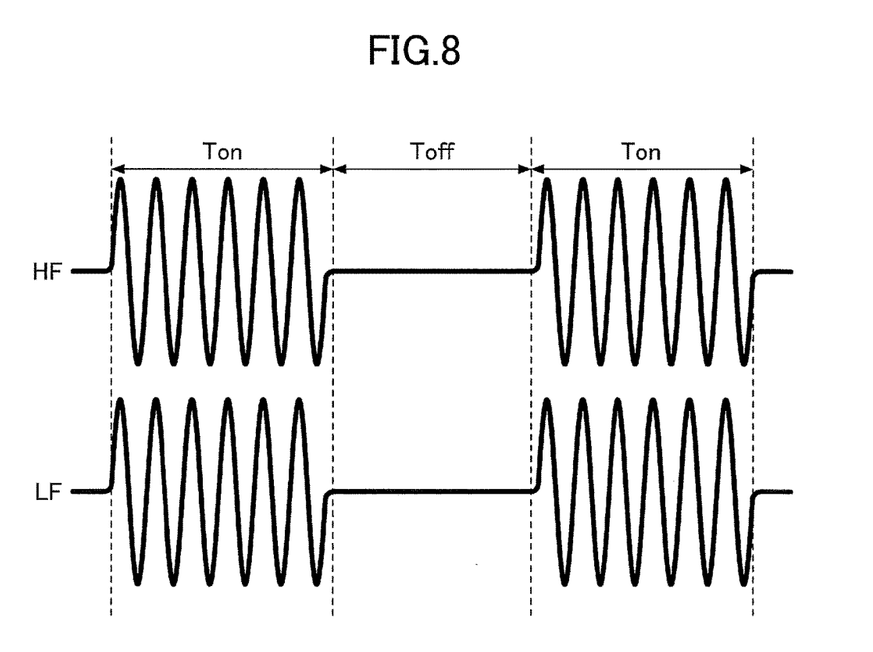
FIG. 8 is a diagram illustrating waveforms of high frequency power according to a second embodiment.

FIG. 8 is a diagram illustrating waveforms of the high frequency power according to the second embodiment.

As illustrated in FIG. 8, in the etching process in the method of plasma etching according to the second embodiment, the first high frequency power HF is repeatedly turned on and off alternately to apply the first high frequency power HF intermittently. Also, synchronized with the first high frequency power HF, the second high frequency power LF is repeatedly turned on and off alternately to apply the second high frequency power LF intermittently.

In the following, time during which the high frequency power HF is applied (on time) will be denoted by "Ton", and time during which the high frequency power HF is not applied (off time) will be denoted by "Toff". With these notations, the first high frequency power HF and the second high frequency power LF are applied as the pulse waves having the frequency of 1/(Ton+Toff). Also, the duty ratio of the pulse waves, which is the ratio of the on time Ton to the total time of the on time Ton and the off time Toff, is represented by Ton/(Ton+Toff).

Specifically, under the following process conditions, plasma etching was executed on the low-k film 201 with the TiN film 203 as the mask. In the second embodiment, the first high frequency power HF and the second high frequency power LF were set as pulse waves, and the duty ratio was controlled to 60% and 90%. The process conditions are as follows:
  the temperature of the lower electrode (the holding table): 10° C.;
  the gas: $CH_2F_2/N_2$;
  the pressure: 30 mTorr;
  the first high frequency power HF: 300 W, a pulse wave, the frequency 5 kHz;
  the second high frequency power LF: 50 W, a pulse wave, the frequency 5 kHz; and
  the DC voltage from the variable DC power source: −450 V.

Figure 9:
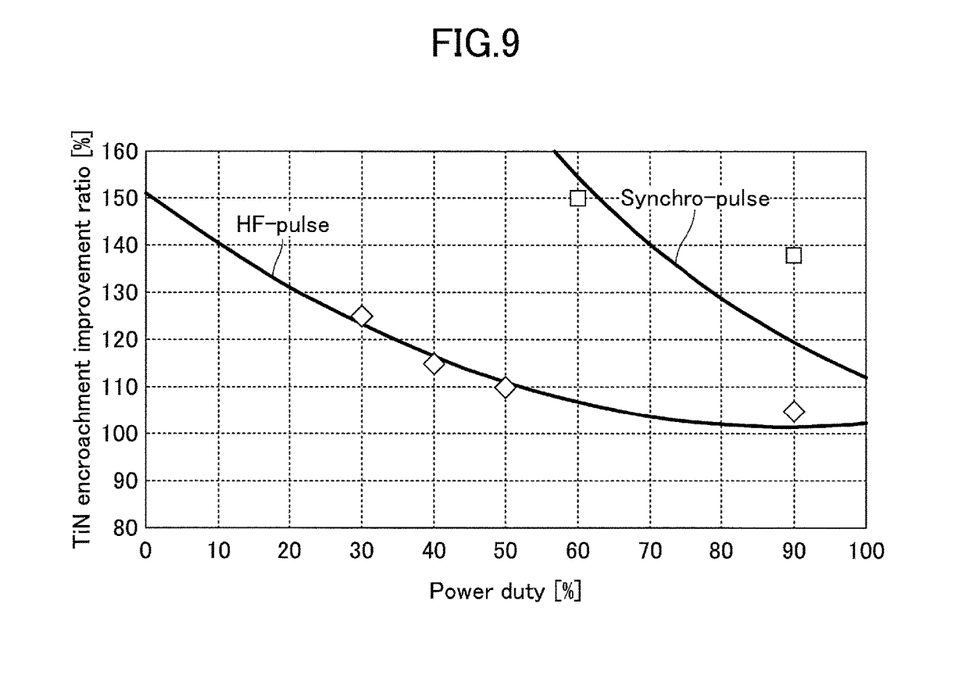
FIG. 9 is a first diagram illustrating an effect of plasma etching according to the second embodiment.

FIG. 9 is a diagram illustrating an effect of the plasma etching according to the second embodiment. FIG. 9 illustrates the improvement ratio (%) of encroachment of the TiN film 203 when the duty ratio of the pulse waves of the first high frequency power HF and the second high frequency power LF was controlled to be 60% and 90%, relative to the case controlled to be the continuous wave. FIG. 9 also illustrates the improvement ratio (%) of encroachment of the TiN film 203, relative to the case described in the first embodiment in which the first high frequency power HF was set to the pulse wave, and the duty ratio was controlled to 30%, 40%, 50%, and 90%.

Note that "Synchro-pulse" in FIG. 9 represents the improvement ratio of encroachment of the TiN film 203 when the first high frequency power HF and the second high frequency power LF were set to the pulse waves, relative to the case controlled to be the continuous wave. Also, "HF-pulse" in FIG. 9 represents the improvement rate of encroachment of the TiN film 203 when the first high frequency power HF was set to the pulse wave, and the second high frequency power LF was set to the continuous wave, relative to the case controlled to be the continuous wave.

As illustrated in FIG. 9, the first high frequency power HF and the second high frequency power LF set to the pulse waves can increase the improvement rate of encroachment of the TiN film 203 more than in the case when the first high frequency power HF was set to the pulse wave, and the second high frequency power LF was set to the continuous wave. In other words, the first high frequency power HF and the second high frequency power LF set to the pulse waves can increase the improvement rate of encroachment of the TiN film 203 further more than in the first embodiment. Also, the duty ratio of the pulse wave of the first high frequency power HF set to 90% or below, can especially increase the improvement rate of encroachment of the TiN film 203.

As done in the first embodiment, the μ-loading effect was evaluated.

In the second embodiment, the first high frequency power HF and the second high frequency power LF are synchronized and intermittently applied, to generate plasma from the process gas that includes fluorocarbon, and by the generated plasma, the etching is executed on the low-k film 201 with the TiN film 203 as the mask. This makes it possible to prevent the μ-loading effect, and to form holes having different opening diameters into the film to be etched, with a uniform depth at the same time.

Specifically, under the following process conditions, plasma etching was executed on the low-k film 201 with the TiN film 203 having multiple openings of different opening diameters, as the mask.
  the temperature of the lower electrode (the holding table): 10° C.;
  the gas: CH2F2/N2;
  the pressure: 30 mTorr;
  the first high frequency power HF: 300 W, a pulse wave, the frequency 5 kHz, the duty ratio 60%;
  the second high frequency power LF: 50 W, a pulse wave, the frequency 5 kHz, the duty ratio 60%; and
  the DC voltage from the variable DC power source: −450 V.

Figure 10:
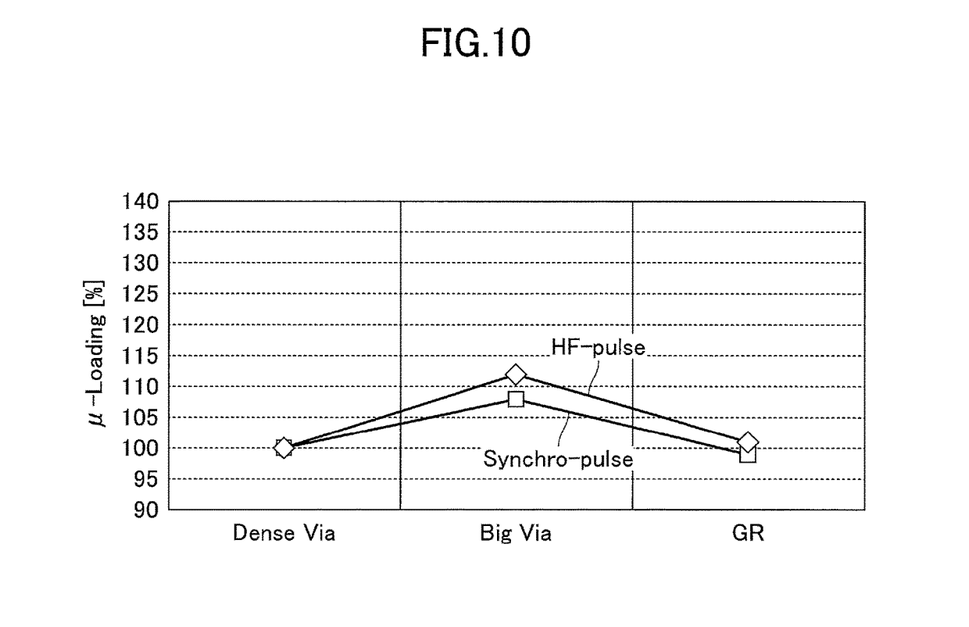
FIG. 10 is a second diagram illustrating an effect of plasma etching according to the second embodiment.

FIG. 10 is a diagram illustrating an effect of the plasma etching according to the second embodiment. FIG. 10 illustrates μ-loading values (%) of a hole having a smaller opening area (Dense Via), a hole having a larger opening area (Big Via), and a guard ring (GR) that have been formed by etching the low-k film 201 with the TiN film 203 as the mask.

Note that "Synchro-pulse" in FIG. 10 represents the μ-loading values when the first high frequency power HF and the second high frequency power LF were set to the pulse waves. Also, "HF-pulse" in FIG. 10 represents the μ-loading values when the first high frequency power HF was set to the pulse wave, and the second high frequency power LF was set to the continuous wave.

As illustrated in FIG. 10, when the first high frequency power HF and the second high frequency power LF were set to the pulse waves, the μ-loading value when the hole having the larger opening area was formed is closer to 100% than in the case when the first high frequency power HF was set to the pulse wave, and the second high frequency power LF was set to the continuous wave. In other words, the difference between the etching depth of the hole having the smaller opening area and the etching depth of the hole having the larger opening area can be virtually eliminated.

Also as illustrated in FIG. 10, when the first high frequency power HF and the second high frequency power LF were set to the pulse waves, the μ-loading value when the guard ring was formed is closer to 100% than in the case when the first high frequency power HF was set to the pulse wave, and the second high frequency power LF was set to the continuous wave. In other words, the difference between the etching depth of the hole having the smaller opening area and the etching depth of the guard ring can be virtually eliminated.

As described above, in the second embodiment, the first high frequency power HF and the second high frequency power LF are used for generating plasma from a process gas that includes fluorocarbon, and by the generated plasma, the etching is executed on the low-k film 201 with the TiN film 203 as the mask. At this moment, the first high frequency power HF and the second high frequency power LF are applied intermittently. This makes it possible to improve the selectivity of the TiN film 203 with respect to the low-k film 201, and hence, to prevent generation of encroachment. Also, according to the method of plasma etching in the second embodiment, it is possible to prevent the μ-loading effect, and to form holes having different opening diameters into the film to be etched, with a uniform depth at the same time.

Also, a DC voltage may be applied to the gas shower head 25 in the second embodiment. This accelerates collision of ions onto the surface of the gas shower head 25, to sputter silicon forming the gas shower head 25, and consequently, silicon-containing deposit is piled up on the surface of the TiN film 203. Therefore, the tolerance to plasma is increased for the TiN film 203, and the selectivity of the TiN film 203 with respect to the low-k film 201 is further improved.

So far, the methods of plasma etching have been described by the above embodiments. Note that the methods of plasma etching according to the present invention are not limited to the above embodiments, but may be changed and improved in various ways within the scope of the present invention.

For example, $CH_2F_2$ and $N_2$ are selected as gas used for the methods of plasma etching in the present disclosure, but the gas is not limited as such. As the gas used for the methods of plasma etching according to the present invention, for example, fluoromethane ($CH_3F$) or trifluoromethane ($CHF_3$) may be used instead of $CH_2F_2$. Either of $CHF_3$, $CH_2F_2$, or $CH_3F$ is an example of gas that includes hydro fluorocarbon.

Also, the methods of plasma etching according to the present invention are applicable to not only a capacitively coupled plasma (CCP) apparatus, but also other plasma etching apparatuses. The other plasma etching apparatuses may include an inductively coupled plasma (ICP) apparatus, a plasma etching apparatus using a radial line slot antenna, a helicon wave plasma (HWP) apparatus, and an electron cyclotron resonance plasma (ECR) apparatus.

Also, the substrate processed by the methods of plasma etching according to the present invention is not limited to a wafer, but may be, for example, a large-size substrate for a flat panel display, an EL (Electro Luminescence) element, a substrate for a solar battery, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method of plasma etching, the method comprising:
an etching process that generates plasma from a process gas that includes fluorocarbon by using first high frequency power output by a first high frequency power source, and by the generated plasma, etches a low-k film with a metal-containing film as a mask,
wherein in the etching process, the first high frequency power is intermittently applied,
wherein in the etching process, a second high frequency power output by a second high frequency power source is continuously applied at a lower frequency than a frequency of the first high frequency power.

2. The method of plasma etching as claimed in claim 1, wherein a duty ratio of the first high frequency power intermittently applied, is less than or equal to 50%.

3. The method of plasma etching as claimed in claim 1, wherein the first and second high frequency power sources are electrically connected to a holding table for holding the substrate.

4. The method of plasma etching as claimed in claim 1, wherein the first high frequency power source is electrically connected to a gas shower head for supplying the process gas and the second high frequency power source is electrically connected to a holding table for holding the substrate.

5. The method of plasma etching as claimed in claim 1, wherein duty ratios of the first high frequency power and the second high frequency power that are intermittently applied, are less than or equal to 90%.

6. The method of plasma etching as claimed in claim 1, wherein the process gas that includes fluorocarbon includes $CH_2F_2$ gas.

7. The method of plasma etching as claimed in claim 1, wherein the metal-containing film includes a TiN film.

8. A method of plasma etching a substrate in a process chamber that includes an upper electrode formed of silicon, and a lower electrode placed facing the upper electrode, the substrate being placed on the lower electrode, the method comprising:
an etching process that generates plasma from a process gas that includes fluorocarbon by using first high frequency power output by a first high frequency power source, and by the generated plasma, etches a low-k film with a metal-containing film as a mask,
wherein in the etching process, the first high frequency power is intermittently applied while a DC voltage is applied to the upper electrode, and
wherein in the etching process, a second high frequency power output by a second high frequency power source is continuously applied at a lower frequency than a frequency of the first high frequency power.

* * * * *